United States Patent [19]
Warner, Jr. et al.

[11] Patent Number: 5,840,589
[45] Date of Patent: Nov. 24, 1998

[54] METHOD FOR FABRICATING MONOLITHIC AND MONOCRYSTALLINE ALL-SEMICONDUCTOR THREE-DIMENSIONAL INTEGRATED CIRCUITS

[76] Inventors: Raymond M. Warner, Jr., 6136 Sherman Cir., Edina, Minn. 55436; Ronald D. Schrimpf, 9855 N. Canyon Brook Pl., Tucson, Ariz. 85741

[21] Appl. No.: 468,968

[22] Filed: Jun. 6, 1995

Related U.S. Application Data

[60] Continuation-in-part of Ser. No. 705,726, May 24, 1991, which is a division of Ser. No. 443,175, Nov. 30, 1989, Pat. No. 5,089,862, which is a continuation-in-part of Ser. No. 861,708, May 12, 1986, Pat. No. 4,885,615, which is a continuation-in-part of Ser. No. 799,652, Nov. 19, 1985, Pat. No. 4,794,442.

[51] Int. Cl.$^6$ .................................................. H01L 21/203
[52] U.S. Cl. ................. 437/128; 437/942; 148/DIG. 158
[58] Field of Search .................................. 437/126, 128, 437/942, 973; 148/DIG. 158

[56] References Cited

U.S. PATENT DOCUMENTS

| | | | |
|---|---|---|---|
| 4,544,418 | 10/1985 | Gibbons | 437/942 |
| 4,548,658 | 10/1985 | Cook | 437/128 |
| 4,717,681 | 1/1988 | Curran | 437/126 |
| 4,728,626 | 3/1988 | Tu | 437/126 |

*Primary Examiner*—Chandra Chaudhari
*Attorney, Agent, or Firm*—Hugh D. Jaeger

[57] ABSTRACT

A method is described for growing a single crystal having three-dimensional (3-D) doping patterns created within it during growth while maintaining a plane growth surface, creating junction-isolated devices and interconnections, forming a 3-D integrated circuit (IC). The crystal is grown as a large number of lightly-doped layers in a single-pumpdown procedure using sputter epitaxy, which offers growth rates for good-quality silicon of at least 0.1 micrometer per minute. The process experiences a stable environment with temperature remaining around 400 C and pressure near 1 millitorr, and the process is "quasicontinuous" in that once each layer is in place, its surface will experience a short series of further steps that create a 2-D doping pattern extending through the layer. It is the merging of many such successive 2-D patterns that creates the desired 3-D doping pattern within the finished silicon crystal. Primary layer growth is the first step in a five-step process; second is the growth of a thinner secondary layer of heavily doped silicon to serve as a source of dopant; third is exposing the silicon surface to an intense, patterned, focused light flash from an LCD (or silicon mirror) pattern generator, causing localized dopant diffusion through the primary layer; fourth is the uniform removal by ion milling of a layer thicker than the secondary layer, thus eliminating all dopant from the primary layer except in the selected portions of it affected by the light-induced impurity diffusion; and fifth is a uniform flash annealing of the primary layer.

26 Claims, 4 Drawing Sheets

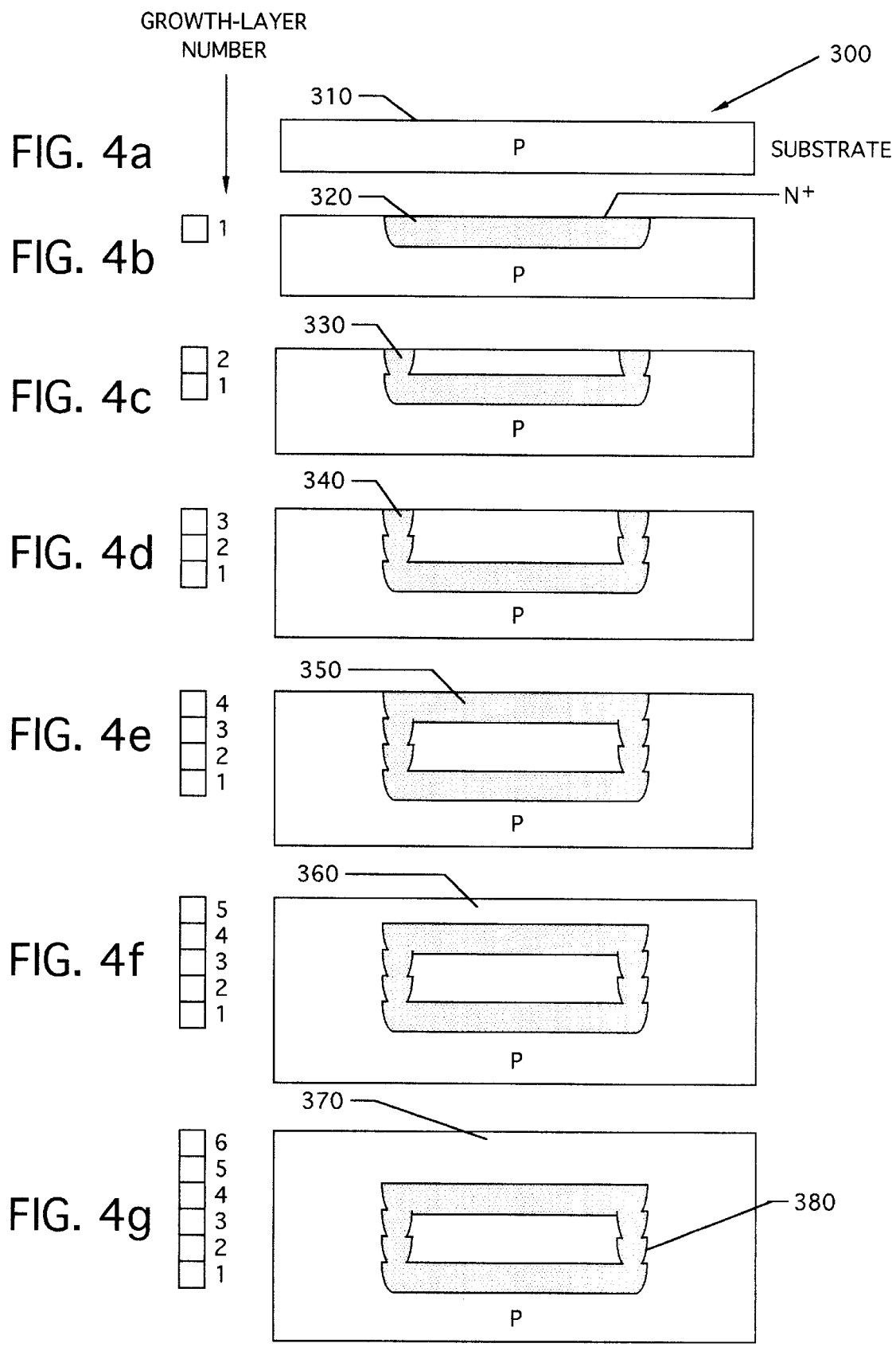

METHOD FOR FABRICATING MONOLITHIC AND MONOCRYSTALLINE ALL-SEMICONDUCTOR THREE-DIMENSIONAL INTEGRATED CIRCUITS

RELATED U.S. APPLICATION DATA

This patent application [Case 5] is a continuation-in-part of Ser. No. 07/705,726 [Case 4], filed May 24, 1991, entitled "Improved Monocrystalline Three-Dimensional Integrated Circuit," which is a divisional application of Ser. No. 07/443,175, filed Nov. 30, 1989, issued Feb. 18, 1992 as U.S. Pat. No. 5,089,862 [Case 3], which is a continuation-in-part of application Ser. No. 861,708 filed May 12, 1986, issued Dec. 5, 1989 as U.S. Pat. No. 4,885,615 [Case 2], which is a continuation-in-part of application Ser. No. 799,652 filed Nov. 19, 1985, issued Dec. 27, 1988 as U.S. Pat. No. 4,794,442 [Case 1].

BACKGROUND OF THE INVENTION

1. Field of the Invention

The present invention relates generally to integrated circuits, and more particularly to three-dimensional integrated circuits, and still more particularly to monolithic, monocrystalline, all-semiconductor, and junction-isolated three-dimensional integrated circuits, and to methods for fabricating them.

2. Description of the Prior Art

The dominant current effort to achieve 3-D organization with integrated circuits is the "multichip module" approach, which places one conventional two-dimensional (2-D) integrated circuit (IC) on top of another, and another on top of that, and so forth. But because the layer of 2-D circuitry in a semiconductor die or "chip" typically occupies less than one percent of its thickness, and hence of its volume, the resulting volumetric packing density is low.

A more ambitious but still brute-force effort to realize a three-dimensional integrated-circuit (3-D IC) employed a technique that became known as "stacking." Probably the most often cited version of this concept is stacked CMOS (complementary metal-oxide-silicon) circuitry. Two or more layers of circuitry were sought in this general approach by cyclic repetition of essentially conventional fabrication-technology steps. [For example, see J. P. Colinge and E. Demoulin, *IEDM Tech. Digest,* 557, December 1981.]

The motivation for attempting to realize 3-D circuits in this manner was to have the convenience of insulators for isolation, and metals for electrical conduction, while taking limited advantage of the third dimension. But in spite of lavish investments in this concept for a period of about a decade, the technology by now has been largely abandoned. Among the numerous shortcomings of stacking are reliability penalties because of the proliferation of interfaces involved. Second, there are yield problems and additional reliability penalties connected with the necessary in-process storage and handling, and because of the proliferation of process steps. Third, there is a serious thermal-conductivity penalty because of the multiple and extensive layers of insulating material of very poor thermal-conductivity properties. Power dissipation is already a problem in 2-D circuitry that is free of such multiple layers, and is clearly more severe in stacked structures. Fourth, "thermal budget" problems in fabrication are severe. The upper levels require higher temperatures for longer times to improve crystallinity, causing the lowest levels to lose impurity definition. Such circuitry is also plagued, fifth and sixth, by inadequate crystalline quality in all but the substrate layer, and inadequate planarity in the advancing free surface, the last leading to problems of inadequate pattern definition. In short, the stacking approach to 3-D structures has amplified problems and shortcomings inherent in prior-art technologies, while offering very marginal benefits. It is at best an evolutionary extension of the prior art.

SUMMARY OF THE INVENTION

The aim of the present invention is to implement fully the recommendations, outlined below, that led to the monolithic IC. The strategic goal is an electronic system of unprecedented reliability, economy, performance, and functional density. The tactical challenge is to combine existing technologies in a way that permits the fabrication of monolithic, monocrystalline, all-semiconductor, three-dimensional, junction-isolated ICs.

The strategic motivation of the present invention has been rare in solid-state electronics. Most prior-art innovation has involved technology-driven evolution. By this is meant that technological refinements and innovations, especially in the process arena, have largely determined the pattern of progress and the character of the product. Clear evidence of this fact is seen in the intense attention and interest that have been focused for decades on minimum-feature-size shrinkage, where reference here is to the element or elements of the lateral IC pattern having the smallest dimension. The appreciable shrinkage that has occurred over a period of some thirty-five years is mainly a consequence of changes and improvements in the photoresist art and related arts. Similar attention has been lavished on the parallel issue of scale-of-integration expansion, which is to say, increasing the number of devices or of functions packed into a single IC or "chip."

The technology-driven character of microelectronics (a term that we take to be synonymous with solid-state electronics) was established at the very beginning. In the 1950s there were so few process options that microelectronics was "technique limited," even in such basic matters as junction formation. Consequently, each major innovation brought a "new transistor" . . . grown-from-the-melt junctions, alloyed junctions, diffused junctions, grown-from-the-vapor (epitaxial) junctions, and ion-implanted junctions. Other major innovations of the 1950s were zone refining, photoresist processing, thermocompression bonding, planar processing, and MOS (metal-oxide-silicon) processing. By 1960, at least two options existed for nearly every fabrication requirement. But the pace of this kind of fabrication-technology innovation and refinement was maintained and continues even today to fuel continuing evolution.

By contrast with this pervasive year-to-year pattern of being technology-driven, there have been at least two prior occasions whereupon strategic thought was applied to electronic-system problems and had a profound effect on the course of progress. The first of these occurred in 1936, when M. J. Kelly of Bell Laboratories enjoined W. Shockley to devise a solid-state substitute for the electromechanical relay, which led to the transistor more than a decade later. (The transistor replaced the vacuum tube as well as the relay, so Kelly's could well have been a dual challenge, but the oneness of switch and amplifier was not as evident in the '30s as it is today).

Kelly's overriding strategic aim in issuing his summons was to improve reliability by replacing the relay with a device having no moving parts. Equally important was the fact that the room-temperature operation of a solid-state amplifier brought major reliability advantages over the vacuum tube that incorporated an incandescent heater. The key strategic challenge posed by Kelly's insight was to identify a solid-state phenomenon that could deliver gain. The accompanying tactical challenge was to fabricate a device exploiting the phenomenon identified, and these twin calls to action launched the evolutionary juggernaut described above.

A second example of strategic thought that produced a break from evolution came along some 22 years after the transistor. Independent efforts by Jack Kilby and Robert Noyce led to the bipolar integrated circuit. Kilby most clearly stated the stakes, goals, and benefits of the innovation and reduced the concept to practice through a prototype embodiment, while Noyce contributed a structural-fabricational concept involving junction isolation that has persisted in part to the present day. Kilby identified the following strategic goals for the designer and fabricator of an electronic system: The improvement of (a) reliability, (b) economy, (c) performance, and (d) functional density (the last through "miniaturization," in the terminology of the time). Further, he stated how to bring about the improvement over thirty-five years ago [U.S. Pat. No. 3,115,581, filed May 6, 1959, and issued Dec. 24, 1963; U.S. Pat. No. 3,138,721, filed May 6, 1959, and issued Jun. 23, 1964; U.S. Pat. No. 3,138,744, filed May 6, 1959, and issued Jun. 23, 1964].

Kilby's patents clearly say that it is necessary (paraphrasing) to minimize the number of different materials embodied in the system, the number of process steps required for fabrication, and the qualitative differences among these process steps, and that the application of these three principles will both require and result in (fourth) the minimizing of the number of separate parts required to realize an electronic system. In other words, he advocated a four-feature minimization approach. Summarizing then, with revised sequence, in order to maximize reliability, economy, performance, and functional density in an electronic system, one must observe four principles: Minimize . . .

1. the number of separate parts in the system;
2. the number of different materials in the system;
3. the number of process steps required for fabricating the system;
4. and the qualitative differences among the process steps used for fabricating the system.

In the second part of his four-part list of principles, Kilby's concern was with the poorly controlled and poorly understood physical and chemical phenomena that occur at dissimilar-material interfaces, especially current-carrying interfaces. The monolithic IC delivered a dramatically lower interface count (at least by an order of magnitude) than did the preceding device-socket-chassis-wire technology. The subsequent explosion in the maximum complexity of feasible electronic systems, especially computers, proved beyond any doubt the validity of his insight concerning reliability.

The third principle, reducing number of fabrication steps, is also inherent in monolithic integration as compared to what went before, and has an obvious direct bearing on improving economy. Less obvious but more important is that fewer steps—fewer chances for error—raises yield, a potent factor in determining costs. The costs for electronic systems in the IC era fell sharply. Increased functional density was an uncontested consequence of monolithic integration, and counter to the predictions of loud opponents of integration, performance also improved.

The fourth and last principle, involving what Kilby termed compatible processes, also has a beneficial effect on yield, and hence on cost. Processes that are compatible are also more easily combined, and this reduces equipment variety and cost, as well as the number of steps involved.

Turn now to FIG. 1. At the left side are listed three general aims Kilby found intuitively desirable, motivating him to formalize his four minimization principles for guiding integration (listed at the top in column two). These principles support the four strategic goals in column five in various combinations. But before treating the balance of FIG. 1, let us look briefly at the implementation inherent in present-day technology of Kilby's four principles. The monolithic IC that is now over thirty-five years old has enjoyed an astonishing success because it delivers a huge improvement with respect to part count, interface count, step count, and step compatibility over a competing product implemented using pre-IC technology, thus delivering strategic-goal improvements.

In addition, the steady evolutionary refinements in minimum feature size and scale of integration produced further advances with respect to the functional-density goal, for obvious reasons. And these same trend lines boosted performance as devices became smaller, and lowered costs with more functions per chip as well as with higher yields from more refined processes. Less obviously, shrinking feature size and growing scale of integration reduced the number of interfaces between dissimilar materials in a system of a given capability.

But now that the IC is in its mid-thirties, some curves are saturating. Feature sizes have continued to shrink for decades, but can't go to zero, which is an impenetrable barrier because there exist optimum dimensions for a given semiconductor device, and they are inevitably nonzero. In the view of the present inventors, IC technology got into its present dilemma because, while it accepted the benefits of Kilby's insights, it has lost sight of his underlying principles, in the process, permitting a retreat from them. This can be seen by examining the process principles one at a time. One of these is to minimize the number of materials in an electronic system, and thus the number of dissimilar-material interfaces in the final structure. Materials systems for ICs have grown more complex over the decades, especially for contact purposes, contributing to the interface count in electrical paths. The multilevel-interconnect schemes (a primitive 3-D effort!) add new materials and interfaces in their attempts to respond to the changing requirements of higher, less-plane interconnection layers.

There is, however, a second aspect to the matter of interfaces. There is good reason to minimize the aggregate area of interfaces in a circuit or system, because it has a bearing on the entity's overall thermodynamic stability. On this matter one can also be quantitative. It is straightforward to calculate an interfacial area per device, or per function, if preferred. Downscaled feature size and upscaled integration produce a favorable trend line with respect to this criterion, probably outweighing the effect of increasing material-system complexity in this case. But the present invention and its four precursor inventions deliver step-function further improvements in both the current-path and aggregate-area aspects of the interface issue.

On the principle concerning minimization of the number of process steps, we have clearly raced headlong in the wrong direction. Thirty years ago one could fabricate an MOS IC with four or five masks, and a bipolar IC with perhaps six. Today the corresponding number is between between ten and thirty for both technologies. At the same time the numbers of substeps accompanying the various masking steps have also proliferated. There are literally hundreds upon hundreds of steps required to fabricate an IC today. The last principle, stating that qualitative differences among the process steps must be minimized, has also not been widely honored. Such differences have, in fact, expanded, and can be illustrated by visualizing the experience of an IC during its fabrication.

An IC as work in process undergoes repeated large temperature excursions, and large pressure excursions, which our invention will reduce to a minimum. It experiences both batch processing and one-at-a-time processing. The work in process undergoes continuous processing, as in crystal growth, and a great deal of discrete-step processing, as in the case of photoresist. Wet versus dry processing constitutes a further dichotomy, and all of this violates Kilby's process-compatibility principle.

Another problem in conventional technology resides at its very heart. The photoresist process, another contribution by the prolific William Shockley [R. M. Warner, Jr., and B. L. Grung, Transistors, Wiley, 1983, page 36], is a major element in the "planar process" of the late '50s that was described by microelectronics pioneer G. W. A. Dummer as "the key to all semiconductor work" [E. Braun and S. Macdonald, Revolution in Miniature, Cambridge University Press, London, 1978, page 85]. But in spite of its essential nature in conventional microelectronics, photoresist processing has been the source of endless problems:

It is dirty, historically being a major contributor of contamination problems, laid at the door of the organic material that is alternately deposited on the IC surface, and then is removed, or approximately removed, in preparation for the next step.

It is complicated. Defining the process segment from one photoresist segment to the next as a photoresist cycle, we count the substeps and discover an average number of approximately fifty.

It is costly, requiring the use of large, complicated, and hence costly machines.

It is heterogeneous. These machines employ widely differing principles and subject the work in process to widely differing environments.

It is a bottleneck. In some steps (such as diffusion), slices are handled in large batches. Then they wait in storage to go through the resist steps one at a time. When a "stepper" (for image projection) is used, the operation is carried out on less than a one-wafer-at-a-time basis, a fact that further illustrates the heterogeneous characterization of photoresist processing made in the previous point. This example further illustrates that the highly touted "batch fabrication" aspect of conventional microelectronics is unevenly applied from operation to operation. In sum, the photoresist process is at best a resolutely a one-wafer-at-a-time process that cannot be incorporated into a continuous or quasicontinuous process, one of the key features of the present invention.

Now return to FIG. 1, which endeavors to display the interrelationships among Kilby's four goals, column five, and four minimization principles, column two. In addition it shows two further minimization principles, column two, identified in the present invention. Columns three and four show how features of the present invention permit full implementation of all six minimization principles in order to achieve fullest realization of the four strategic goals, and these features will be treated below.

To Kilby's four principles, we add the two additional minimization principles emobodied in the present invention. They are to minimize wasted volume by going from 2-D to 3-D structure (thus maximizing functional density), and to minimize morphological variety by going from combined amorphous, polycrystal, and single-crystal materials to a monocrystalline IC.

From all six of the minimization principles, tie lines are drawn in FIG. 1 to indicate the connections between the principles in column two and the goals in column five. There exist direct ties and indirect ties through features of the present invention that are the means for implementing the principles. The broadest features of the present invention are identified in column three, while those listed in column four flow from the broader features.

The present invention carries Kilby's insights to their logical extremes. First, we reduce the number of materials within the IC itself from a present-day minimum of perhaps ten materials to one, a semiconductor material. It is reasonable for present purposes to treat a semiconductor material as a single material, no matter how it is doped, because doping densities are so miniscule. Silicon is preferred, but it is obvious that the principles here could be used with a different material. Second, the present invention also reduces the number of process steps to an absolute minimum—one step, carried out quasicontinuously. A quasicontinuous process is one in which a primary process for crystal growth is briefly interrupted once or many times, provided that the work in process experiences only minor environmental changes, and no handling.

In line with Kilby's last principle, all procedures are fully compatible. The work in process is subjected to minor global (averaged overall) temperature excursions, reduced fully an order of magnitude from those of conventional practice. The pressure remains throughout the process in the neighborhood of one millitorr. Sputter epitaxy (described below) is the preferred method to be used for crystal growth, and compatible ion milling is used for material removal.

The present invention goes beyond Kilby's dictates and also beyond present practice, with the two additional principles it provides. First it endeavors to use electronically the approximately 99% of silicon volume that in the 2-D IC of today is nothing more than a mechanical support. Second, it makes the IC monolith monocrystalline throughout, in contrast to today's IC products that typically incorporate phases of differing morphology. That is, today's products incorporate phases that are separately monocrystalline, polycrystalline, and amorphous. These differing morphologies in addition to differing material identities cause interface problems to be more severe than necessary.

Now focus on additional features of the present invention. Photoresist processing is replaced in the present invention by an in situ patterning method, since no one has ever outlined even conceptually a continuous photoresist process. A light pattern projected on the growing crystal surface is the preferred method for achieving lateral definition, and this can be done through a window in the vacuum-chamber wall.

The pattern of light, sharply focused on the silicon surface, is created by an electronically controlled pattern generator and projector. One candidate as the pattern generator is a liquid-crystal display (LCD), and another is a silicon-mirror array, both fully controlled electronically. (Recent progress in both technologies has been striking; interestingly, these developments have aimed at TV-quality full-color imaging, wholly bypassing the less challenging application of pattern generation, which is binary, black-and-white, and relatively slow.) The light pattern causes localized heating of the silicon surface, and the accompanying localized diffusion of doping impurities from the surface toward the interior of the crystal creates a 2-D pattern extending through the layer thickness. The merging of thousands of such 2-D patterns creates the desired pattern of 3-D doping in the single crystal.

The crystal will be grown quasicontinuously using the crystal-growth process known as sputter epitaxy. This process was proposed by Wehner in the '50s [G. K. Wehner, U.S. Pat. No. 3,021,271, filed Apr. 27, 1959, issued Feb. 13, 1962], and reduced to practice in the '80s [G. K. Wehner, R. M. Warner, Jr., P. D. Wang, and Y. H. Kim, *J. Appl. Phys.* 64, 6754, (1988)]. It is capable of growing high-quality silicon crystal at a rate of at least 0.1 micrometer per minute at a temperature in the neighborhood of 400 C., and at a pressure of about 1 millitorr. For good measure, this single process is carried out in a single system, employing a single pump-down.

The crystal will be grown as a series of thin layers. The process is "quasicontinuous" in the sense that once each layer is in place, it will experience a short series of further steps that create a 2-D doping pattern extending through the layer, but these interruptions are brief and involve no handling of the work in process. There are five steps in the series, and this five-step procedure will be repeated thousands of times to create the finished silicon crystal containing a 3-D doping pattern.

Let us examine the procedure in more detail. For convenience, consider the case of a structure with a lightly doped P-type matrix that constitutes the bulk of the finished crystal. Within it is buried an interconnected structure consisting of N-type silicon that is appreciably more heavily doped than the surrounding P-type matrix and is approximately uniform throughout in doping density. The N-type portions constitute devices and their interconnections.

Let the vacuum system employ mercury atoms for sputtering and milling as well as the triode configuration, the kind of system described and used by Wehner. Three silicon samples are positioned in the chamber in somewhat the manner shown schematically in FIG. 2. The substrate upon which the 3-D IC will be grown is positioned parallel to a window through which a light pattern can be projected. The system is then pumped down, and a mercury plasma is created by customary means in the region occupied by the three silicon samples.

The mercury pressure is adjusted to approximately 1 millitorr, and all three samples are subjected, jointly or one at a time, to mild ion milling for the purpose of a final cleaning of their surfaces. This is accomplished by making the silicon samples slightly negative with respect to the plasma potential, so that bombardment of the surfaces by positive mercury ions will remove one or a few monolayers of silicon as well as any adhering impurities, all of which are promptly pumped away from the chamber. The ion-milling process has two attributes that are of great importance here. First, it permits precise control of the thickness of material removed. And second, it preserves the surface planarity of the substrate sample.

A mechanical shutter is provided for each sample and for the window of the vacuum chamber. These shutters, not shown for the sake of graphical simplicity, are provided to protect those four surfaces from sputtered atoms at particular times in the process. During the cleaning step just described, for example, the window is protected by moving its shutter in position to shield the window from the balance of the chamber, while the three silicon samples have their shutters retracted, jointly or one at a time, for ion milling. Since the cleaning step is performed only once, before commencing the first epitaxial growth, the particular pattern of shutter deployment just described will not be repeated. Now the system is ready for the first five-step cycle, which cycle will be repeated thousands of times. We label the five parts of the cycle with the letters a through e, and now discuss each in more detail.

a. With shutters protecting the window and $N^+$ silicon, perform epitaxial growth on the substrate. The P silicon sample, biased negatively for heavy ion bombardment, is the "target" or source of silicon atoms for straight-line delivery to the substrate. It has been shown by Wehner that dopant is transferred to the substrate in the same density present in the target, a mass-conservation principle that holds in spite of differing sputtering rates for silicon and the dopant. If, for example, the dopant has a lower sputtering rate, then it accumulates on the target surface in just the right quantity to compensate for the rate difference. To reach this equilibrium condition, the substrate is shuttered briefly before the first sputtering step to prevent deposition on it of an incorrect composition. A representative doping density in the P-type target would be in the neighborhood of $10^{15}$ per $cm^3$. A representative thickness for the primary epitaxial layer grown in this step would be 200 to a few thousand monolayers, depending upon the nature of the pattern that is to be created. (Ten thousand monolayers of silicon corresponds to a thickness of the order of one micrometer.) FIG. 3a represents the sample after this step.

b. With shutters protecting the window and P-type target, perform the epitaxial growth of an $N^+$ layer, thinner than before, using the $N^+$ target. This secondary layer will typically be 20 to a few hundred monolayers thick, and will have a doping in the neighborhood of $5\times10^{17}$ per $cm^3$. FIG. 3b represents the sample after this step. The purpose of this layer is to serve as a source of dopant for a diffusion procedure, the next step.

c. Remove the shutter from the window, and through the window project a brief but intense pattern of light focused on the surface of the last epitaxial layer. This causes the localized diffusion represented in FIG. 3c. The intensity and duration of the light flash are adjusted (experimentally, if necessary) so that impurity diffusion penetrates through the epitaxial layer grown in step a.

d. Shutter-protecting all elements except the work in process, then execute ion milling once more with a duration just long enough to remove completely the heavily doped secondary layer grown in step b. This will then leave N-type dopant only in those regions of the sample that experienced localized impurity diffusion, with a result as shown in FIG. 3d.

e. Finally, expose the sample surface to a uniform light flash of duration and intensity chosen to accomplish flash annealing of the last primary layer, thus eliminating any crystal damage created during ion milling, and activating a maximum of the dopant impurities as well. This step is represented in FIG. 3e.

The five-step procedure described immediately above creates an essentially two-dimensional $N^+$ pattern in a single epitaxial layer. It is then repeated with the same or a different pattern. If the pattern is the same, and a number of repetitions are carried out, then what was a shallow, essentially 2-D pattern is gradually converted into a "wall" of $N^+$ silicon embedded in the p-type matrix. If a completely unpatterned layer is desired, probably a rare situation, then one simply omits steps b through d.

When a new pattern is introduced, it will merge with the underlying pattern if the new pattern covers any portion of the original pattern. If on the other hand the new pattern avoids the doped regions created by the first, then it of course does not merge and can become part of an electrically independent structure. The (probably unusual) provision of a few undoped (unpatterned) layers in a 3-D structure is a way to achieve a total separation of parts.

To illustrate a typical 3-D pattern realized by the method of this invention, let us take the example of an $N^+$ box buried in a P-type crystal with totally seamless crystallinity throughout the sample. FIGS. 4a through 4g shows the construction of a buried box by using six grown layers. While the diagrams are illustrative, one should understand that in a practical case, the construction of such a 3-D boxlike pattern would typically employ a larger number of layers.

In FIG. 4a is represented the P-type starting substrate. FIG. 4b shows the creation of layer 1, the bottom of the box, using a simple rectangular pattern of light at the diffusion step. In FIG. 4c, a "picture frame" pattern was used to commence construction in layer 2 of the sides of the box, and the same pattern is repeated in layer 3, FIG. 4d. Next, FIG. 4e places the "lid" on the box in layer 4, merging it with the sides. FIGS. 4f and 4g, then, add layers 5 and 6 that complete the burying of the box. The squares drawn at the left of FIGS. 4b through 4g represent the "stack" of layers assembled up to that point upon the substrate in FIG. 4a. It must be clearly understood that each layer represented in FIGS. 4b through 4g is the product of carrying out all five of the steps described in detail above and FIGS. 3a through 3e.

Our precursor patents have described in detail a number of device options for 3-D ICs and their junction-isolated silicon interconnections. Of these, the bipolar junction transistor (BJT) and the junction field-effect transistor (JFET) require isolation in the 3-D case. A way to accomplish such isolation was described in the patents and was named "box isolation." An opposite-type region, much like the box of FIG. 4g, surrounds the device to be isolated.

This method, however, in most cases requires the box to be "split" in order not to constitute a short circuit, and this too could be accomplished by using a structure that was reduced to practice, and that we named an orthogonal isolator. The essence of the orthogonal isolator is a pair of closely spaced PN junctions. With bias applied in a direction normal to the junctions, the structure is a punchthrough diode, and in the orthogonal (accounting for the name) direction, the structure is a pinched-off JFET channel. Both devices exhibit very high resistance at low voltages, a property desired for isolation; from one part of the box to the other, one sees the former device, and from inside the box to outside, one sees the latter.

The same pair of closely spaced junctions has further utility. In the punchthrough-diode mode, it can be used as a self-isolating level shifter, or voltage regulator. The structure also constitutes the essence of a depletion-mode JFET, a well-known device in silicon [C. Arnodo and G. Nuzillat, *Review Technique Thomson-CSF*, 7, p. 281 (1975)], satisfying the designer's preference for E-mode operation, and eliminating the need for level shifting.

The devices in the foregoing examples do not exhaust the options open to the 3-D designer. An additional option is a self-isolating and depletion-mode JFET-like device known as the merged FET, or MFET. [W. T. Cardwell, Jr., U.S. Pat. No. 4,638,344, filed Apr. 15, 1982, and issued Jan. 20, 1987.] It differs from a conventional JFET in that a gate region is separated from the channel not by a single junction, but by two closely spaced junctions, one that can be described as the gate junction, and the other, as the channnel junction. Their depletion layers interact by virtue of proximity. Manipulation of depletion-layer thickness in the former causes modulation of that belonging to the latter, and hence causes modulation of the degree of channel depletion. Cardwell placed his devices at a semiconductor surface, with all of their terminations proceeding directly to that surface, so he did not foresee the present concept of an all-semiconductor 3-D IC.

In our case, truly 3-D, at least one buried device is connected to at least one similarly buried device, and is not connected through a nodeless conductor to a surface. It is noteworthy that a 3-D array of MFETs can be generated by only minor elaboration of the simplistic procedure outlined above for creating the box example. A lightly doped additional N-type target would have to be included in the sputtering system for growing the lightly doped MFET channels. These would then make ohmic contact to the heavily doped N-type ends or terminations of the channels. The self isolation and E-mode character of the MFET make it an attractive candidate device.

It is worth noting at this point that device structures, even those relatively complicated in terms of doping variety, can be realized by providing additional targets. For example, if both $N^+$ and $P^+$ targets are incorporated into the system, with the doping of each target higher than suggested above, then tunnel junctions can be created for use as ohmic contacts, a well-established practice in conventional technology. Because the temperature employed in silicon sputter epitaxy is so low, the necessary junction abruptness will be preserved through many hours of crystal growth.

Note further that the introduction of additional targets is a minor complication, because all that is necessary to bring them into play is shutter manipulation and an electrical bias, both readily programmed and automated. And also note that differing patterns of differing doping can be created in the same epitaxial layer by going from step e of FIG. 3e back to step b of FIG. 3b, rather than all the way back to step a FIG. 3a.

In summary, we outline the ways in which the present invention moves IC technology toward fuller realization of the four strategic goals of electronic-system design and fabrication. Start with improved functional volumetric density, the important kind of density in our three-dimensional world. The 3-D structure of the new ICs permits major improvement, even with relaxation, where desirable, in minimum feature dimensions. The dominating single-crystal volume in today's product that performs nothing but a mechanical function is put to electronic use.

Second is economy. The flexibility inherent in the single-chamber apparatus means that these will be able to produce varied products, will be used in huge numbers, and hence will be mass-produced. For the first time, equipment for IC fabrication will experience the powerful economies of mass production (fully compatible with product refinement, as auto history illustrates). Further economies arise out of the fact that the new machines will be able to operate efficiently in less costly factory floorspace than today's technology requires, from the elimination of work-in-process handling and storage, and from associated yield improvement.

Third, the new 3-D products will deliver performance improvements in digital circuitry through fast and efficient error-correction methods that arise from 3-D memory organization, through heightened interconnection flexibility in random logic. Both kinds of digital ICs will benefit from short signal paths. Crosstalk-free operational amplifiers will be possible through 3-D path separation. Beyond this, highly paralleled and copiously interconnected neural networks will be possible for the first time.

To economy, density, and performance, it is important to add, fourth, reliability, the primary motivating force for the IC of 1959, and for the 3-D IC as well. The high reliability of 3-D IC products will stem from the near elimination of dissimilar-material interfaces, from the total elimination through monocrystallinity of morphological difference, from automatic and contamination-free fabrication, and from such operational factors as small signal-arrival skew.

Monolithic 2-D integration led to improvements over the prior technology in these four properties through attributes that are now well understood. Monolithic, monocrystalline, 3-D integration provides a logical extension of these attributes and will further increase the four desirable properties significantly.

It is important to make a point that has not been made above, but that has a further bearing on economy and reliability. A substantial portion of the time, effort, and cost embodied in today's fabrication methods is related to cleaning the work in process. At least two factors make all this cleaning necessary: (1) Inherently dirty procedures, such as photoresist processing, are at the heart of the technology. (2) Storage and handling of the work in process offer further opportunities for contamination. Going to a quasicontinuous, single-chamber, single-pumpdown fabrication method eliminates the need for nearly all cleaning steps. This last point has its ironic side. Execution of fabrication in a single vacuum system, highly replicated, means that these systems can be adequately operated in clean space much less rigorously controlled than those of today; the clean room is inside the vacuum system, and not outside.

One significant aspect and feature of the present invention is a method for fabricating a monolithic, monocrystalline, all-semiconductor, three-dimensional, integrated circuit, or IC.

Another significant aspect and feature of the present invention is a method for fabricating an IC involving minimal pressure and global-temperature excursions and highly compatible processes.

Still another significant aspect and feature of the present invention is a quasicontinuous, single-pumpdown, fully automated, and totally in situ method for fabricating an IC.

A further significant aspect and feature of the present invention is creation of a 3-D doping pattern by the merging of many successive 2-D doping patterns that each extend through the thickness of a thin and newly grown layer.

Still another significant aspect and feature of the present invention is an electronically controlled pattern generator that delivers light energy to selected portions of the silicon surface, causing localized impurity diffusion through localized instantaneous heating.

Another significant aspect and feature of the present invention is the possibility of creating patterns of differing doping in the same epitaxial layer.

Still another significant aspect and feature of the present invention is flexibly programmable IC fabrication.

Finally, another significant aspect and feature of the present invention is the creation of successive layers with 2-D doping patterns by employing a five-step procedure to realize each layer.

Having thus described embodiments and features of the present invention, we note that it is a principal object of the invention to maximize IC reliability, economy, volumetric functional density, and performance.

Another object of the invention is to provide a method for fabricating an IC involving minimal pressure and global-temperature excursions and highly compatible processes.

A further object of the invention is to create a single-pumpdown, fully automated, and totally in situ method for fabricating an IC.

A further object of the invention is to provide a method for fabricating an IC involving the creation of a 3-D doping pattern by the merging of many successive 2-D doping patterns that each extend through the thickness of a thin and newly grown layer.

Yet another object of the invention is to employ an electronically controlled pattern generator that delivers light energy to selected portions of the silicon surface, causing localized impurity diffusion through localized instantaneous heating.

A further object of the invention is to define a method capable of using versatile, flexible, and mass-producible fabrication equipment.

Finally, yet another object of the invention is the relaxation of clean-room requirements.

BRIEF DESCRIPTION OF THE DRAWINGS

FIGS. 4a through 4g illustrate six applications of the five-step cycle of FIGS. 3a through 3g in order to create a simple 3-D doping pattern in a silicon single crystal.

DESCRIPTION OF THE PREFERRED EMBODIMENTS

Figure 1:
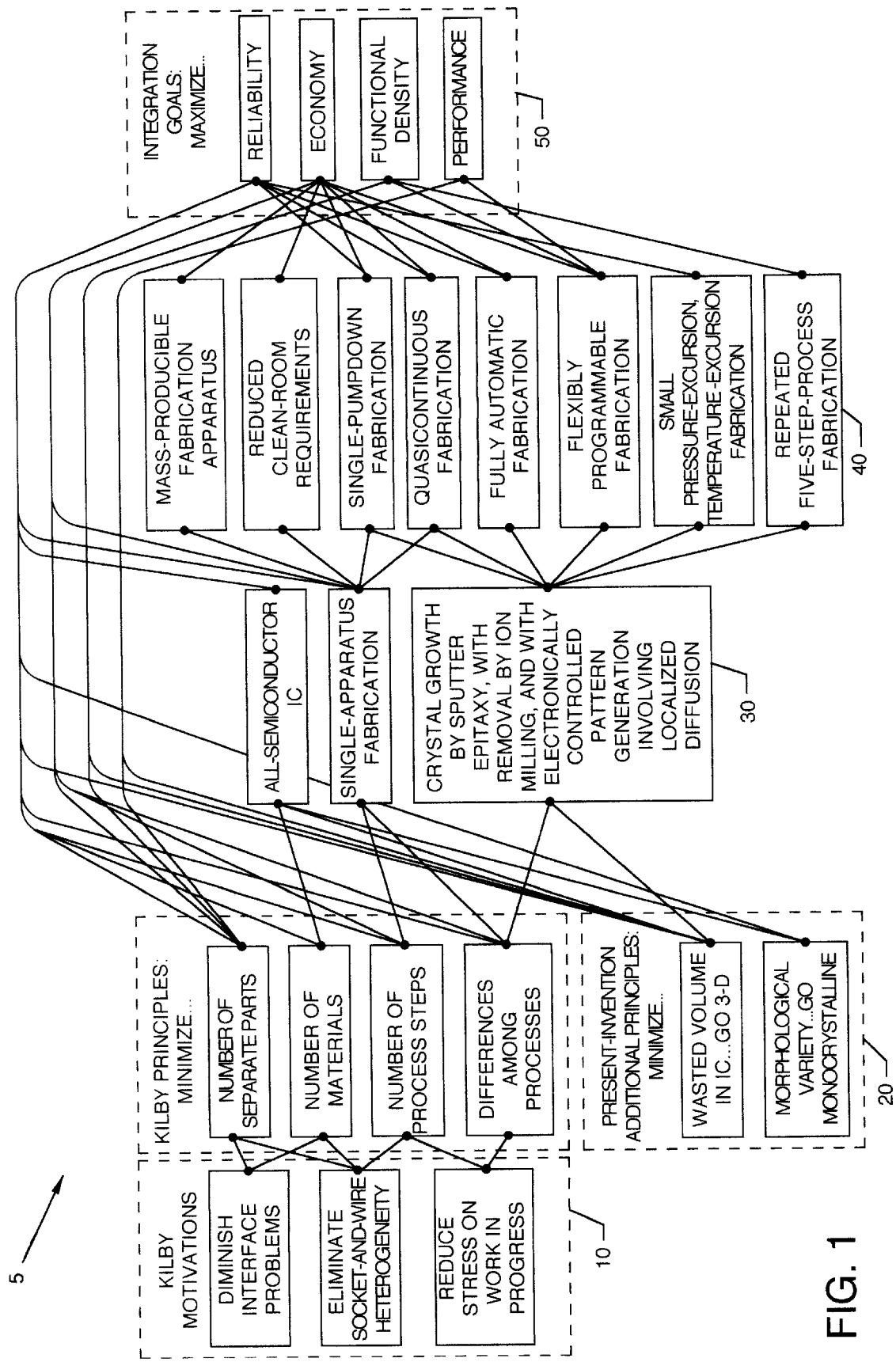
FIG. 1 illustrates the relationships of minimization principles given by Kilby and by the present inventors to Kilby's goals of integration, showing how features of the present invention permit fuller realization of the goals.

FIG. 1 illustrates by means of a chart 5 the relationships of principles and goals pertaining to electronic systems that were articulated by Kilby. The chart 5 comprises the five columns 10, 20, 30, 40, and 50, each listing several relevant elements of Kilby's insights, and (or) features and insights of the present invention. Column 10 gives desirable departures from the technology of the '50s perceived by Kilby that motivated him to formalize the four minimization principles at the top of column 20. The two additional minimization principles at the bottom of column 20 are new departures embodied in the present invention. Column 30 lists broad features of the present invention, and column 40 lists desirable features of the present invention that flow from them, while column 50 lists the four goals of electronic integration enunciated by Kilby. Tie lines connecting the elements of all five columns show sequiturs and relational consequences.

Figure 2:
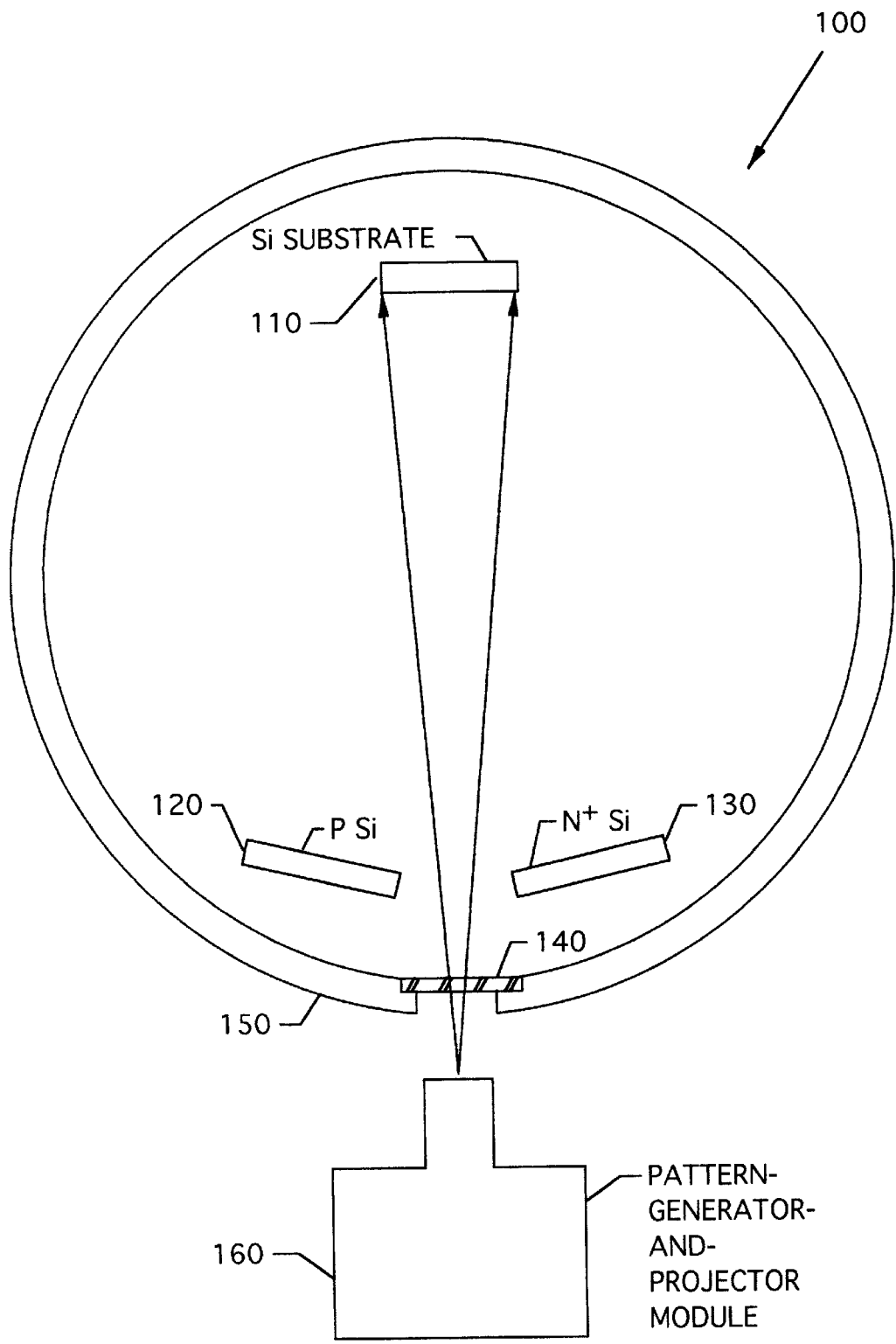
FIG. 2 illustrates schematically a horizontal cross section of a triode-sputtering chamber for carrying out the quasicontinuous crystal-growth process of the present invention.

FIG. 2 illustrates schematically a horizontal cross section 100 of a triode-sputtering chamber for carrying out the crystal-growth process of the present invention, showing some of the features. The silicon substrate 110 has the single crystal 3-D IC grown upon it by sputter epitaxy. The P-type target 120 is the source employed for growing the matrix, or bulk, of the crystal. The $N^+$ silicon target 130 is used for growing a thin epitaxial layer at one step of the 5-step cycle used to create the 3-D IC quasicontinuously. At another step of the 5-step cycle, the window 140 in the chamber wall 150 permits the projection of a pattern of light into the chamber, to be focused on the surface of the substrate 110, and later work in process, to cause the localized diffusion that creates a 2-D pattern in the silicon layer most recently grown. The pattern-generator-and-projector module 160 incorporates a silicon-mirror array or an LCD to serve as an electronically controlled pattern generator.

Figure 3A:
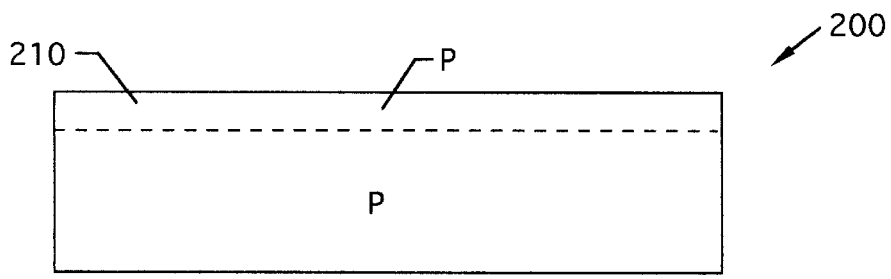
FIGS. 3a through 3e illustrate the five-step cycle that is carried out repeatedly in order to create a thin silicon layer having an essentially 2-D doping pattern that extends through the layer.
Figure 3B:
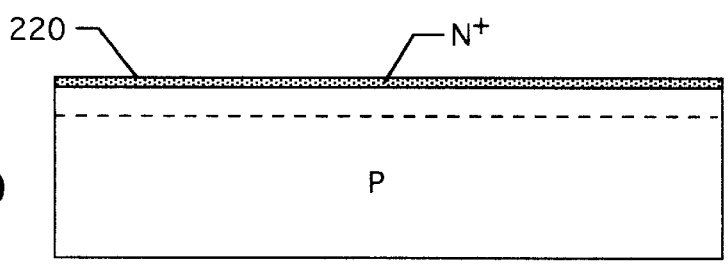
Figure 3C:
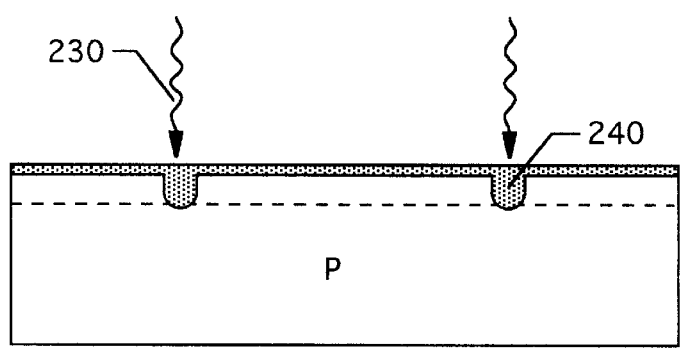
Figure 3D:
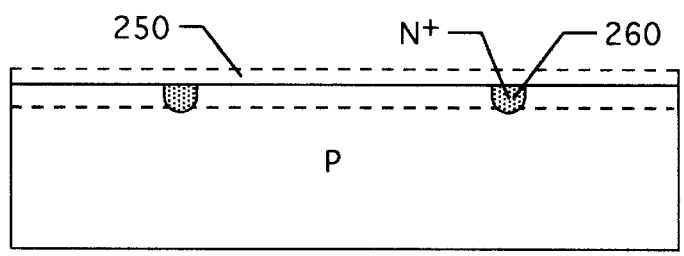
Figure 3E:
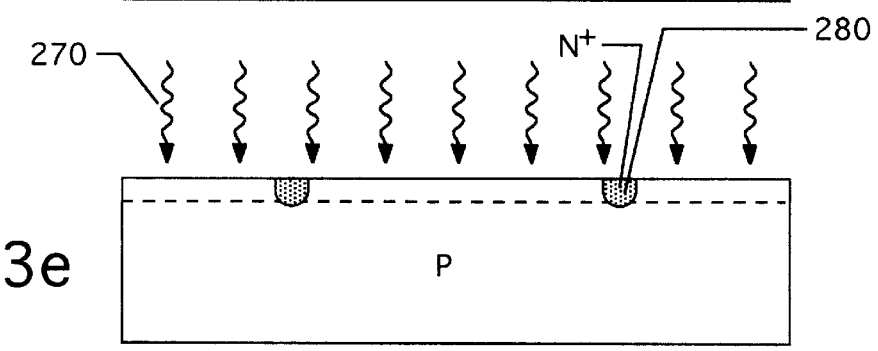

FIGS. 3a through 3e illustrate a set 200 of sequential cross sections representing the five-step cycle that is carried out repeatedly in order to create a thin silicon layer having an essentially 2-D doping pattern that extends through the layer. In FIG. 3a, a thin primary layer 210 is grown using the P-type target 120 of FIG. 2. In FIG. 3b, a thinner secondary layer 220 is grown using the N$^+$ target 130 of FIG. 2. In FIG. 3c, a patterned light flash 230 causes diffusion through the primary layer of N-type dopant in localized regions, with one example being the region 240. In FIG. 3d, ion milling causes uniform removal of a portion 250 of the silicon surface, leaving N-type dopant only in a region of localized diffusion, with one example being the region 260. In FIG. 3e, a general (unpatterned) light flash 270 causes annealing of the last-grown primary layer of the silicon crystal, leaving just a 2-D pattern for which region 280 is one example, in an otherwise P-type silicon crystal. Merging of subsequent 2-D patterns creates the ultimate 3-D pattern.

FIGS. 4a through 4g illustrate a set 300 of sequential cross sections representing the result of repeated applications of the five-step cycle of FIGS. 3a through 3e in order to create a simple 3-D doping pattern in a silicon single crystal. In the simplified six-part example shown here, FIG. 4a represents a starting substrate 310. Next, FIG. 4b represents the substrate 310 augmented by the growth layer 320 that is the result of carrying through the five-step cycle of FIGS. 3a through 3e using a uniform rectangle as light pattern to create the N-doped region 320. After that, FIG. 4c represents the result of carrying through in the next growth layer the five-step cycle of FIGS. 3a through 3e using a "picture-frame" shape as light pattern to create the N-doped region of which one example region is 330. Then, FIG. 4d shows the result of carrying through the five-step cycle of FIGS. 3a through 3e, again using a "picture-frame" shape as light pattern to create the N-doped region of which one example region is 340. Next, FIG. 4e represents the result of carrying through the five-step cycle of FIGS. 3a through 3e, once again using a uniform rectangle as light pattern to create the N-doped region 350. After that, FIG. 4f represents the result of carrying through the procedure of FIGS. 3a through 3e but omitting the intermediate steps of FIGS. 4b, 4c and 4d to create the undoped layer 360. Finally, FIG. 4g represents the result of carrying through the procedure of FIGS. 3a through 3e, again omitting the intermediate steps of FIGS. 4b, 4c and 4d to create the undoped layer 370, completing the burying of an N-type box 380 inside the otherwise P-type silicon crystal, with the number designations of the successive layers grown in sequence indicated at the left of each cross-sectional drawing, 4b through 4g.

Various modifications in materials, sequences, and dimensions can be made to the present invention without departing from its apparent scope and intent.

What we claim is:

1. A method for fabricating a monolithic silicon IC that is 3-D in the sense that it comprises two or more layers of circuitry, using sputter epitaxy to grow a large number of uniform, thin layers of silicon on a lightly doped, type-1, plane-surfaced silicon substrate, each layer embodying an opposite-type (type-2) doping pattern that is essentially two-dimensional (2-D), and through the merging, where desired, of these 2-D doping patterns, creates a 3-D doping pattern, with each of said 2-D-patterned silicon layers being created by a repetition of this five-step cycle:

a. sputter-epitaxial deposition of a lightly doped type-1 primary layer by using a lightly doped type-1 silicon target;

b. sputter-epitaxial deposition of an appreciably thinner and heavily doped type-2 silicon secondary layer by using a heavily doped type-2 semiconductor target;

c. diffusion in selected areas of the type-2 impurity by subjecting the silicon surface to an incident, focused, patterned light flash, with the resulting 2-D pattern of diffused impurity extending through the primary layer grown in step a;

d. removal by using ion milling of a surface layer from the silicon, said layer being thicker than the secondary layer grown in step b, thus eliminating type-2 impurity from the primary layer grown in step a except from the regions of localized diffusion;

e. rapid flash annealing of the primary (step a) layer by using general (unpatterned) light incident upon the silicon surface.

2. Method of claim 1 including at least one additional silicon target having a combination of doping type and density that is different from those cited in parts a and b of claim 1, and that is used to create patterned doping in the last-grown primary layer.

3. Method of claim 1 including at least one additional silicon target having a combination of doping type and density that is different from those cited in parts a and b of claim 1, and that is used to create patterned doping in an already patterned last-grown primary layer by executing steps b through e only of the five-step cycle.

4. Method of claim 1 wherein an unpatterned layer is introduced into the 3-D monolith by executing steps a and e only of the five-step cycle.

5. Method of claim 1 carried out in a quasicontinuous manner.

6. Method of claim 1 carried out in a single apparatus.

7. Method of claim 1 carried out in a way that subjects the work in process to relatively small global temperature excursions.

8. Method of claim 1 carried out in a way that subjects the work in process to relatively small pressure excursions.

9. Method of claim 1 carried out in a closed system.

10. Method of claim 1 carried out in a single-pumpdown operation.

11. Method of claim 1 comprising a liquid-crystal display that serves as an electronically controlled pattern generator.

12. Method of claim 1 comprising a silicon-mirror array that serves as an electronically controlled pattern generator.

13. Method of claim 1 to create a monocrystalline IC.

14. Method of claim 1 to create an all-semiconductor IC.

15. Method of claim 1 to create a junction-isolated IC.

16. Method of claim 1 in which the crystal-growth surface remains substantially plane from start to finish of fabrication.

17. Method of claim 1 wherein the patterned incident light is provided by the combination of an electronically controlled pattern generator, an intense, energetic light source, and a projection system.

18. Method for fabricating a three-dimensional (3-D) monolithic integrated circuit (IC) that deposits in sequence a large number of thin, uniform, lattice-matched semiconductor layers on a single-crystal substrate, and wherein at least one essentially two-dimensional doping pattern is created in each layer, extending through the entire thickness of the layer, before the subsequent layer is grown, so that by occasional changing of the 2-D pattern from one layer to the next and by merging the patterns of one layer and the next, a 3-D doping pattern is created in the monolith, said pattern involving at least one impurity in addition to the background impurity of the matrix.

19. Method of claim 18 wherein said monolith comprises at least one material from the following group:
  a. silicon;
  b. germanium;
  c. diamond;
  d. silicon carbide;
  e. aluminum antimonide;
  f. boron phosphide;
  g. gallium arsenide;
  h. gallium aluminum arsenide;
  i. gallium phosphide;
  j. indium phosphide;
  k. cadmium sulfide;
  l. cadmium selenide;
  m. cadmium telluride;
  n. zinc oxide;
  o. zinc sulfide.

20. Method of claim 18 carried out in a quasicontinuous manner.

21. Method of claim 18 carried out in a single apparatus.

22. Method of claim 18 carried out in a way that subjects the work in process to relatively small global temperature excursions.

23. Method of claim 18 carried out in a way that subjects the work in process to relatively small pressure excursions.

24. Method of claim 18 carried out in a closed system.

25. Method of claim 18 carried out in a single-pumpdown operation.

26. Method of claim 18 comprising in-situ patterning.

* * * * *